United States Patent [19]

Niino et al.

[11] Patent Number: 4,751,099

[45] Date of Patent: Jun. 14, 1988

[54] METHOD OF PRODUCING A FUNCTIONALLY GRADIENT MATERIAL

[75] Inventors: Masayuki Niino, Sendai; Akio Suzuki, Miyagi; Toshio Hirai, 4-91, 3-chome, Takamori, Izumi-shi, Miyagi-ken; Ryuzo Watanabe, 15-12, 3-chome, Dainohara, Sendai-shi, Miyagi-ken; Tohru Hirano, Sakai; Nobuhito Kuroishi, Itami, all of Japan

[73] Assignees: National Aerospace Laboratories of Science and Technology Agency, Chofu; Toshio Hirai, Isumi; Ryuzo Watanabe, Sendai; Daikin Industries, Ltd.; Sumitomo Electric Industries, Ltd., both of Osaka, all of Japan

[21] Appl. No.: 947,419

[22] Filed: Dec. 24, 1986

[30] Foreign Application Priority Data

Dec. 28, 1985 [JP] Japan .................................. 60-297042

[51] Int. Cl.$^4$ .............................................. B05D 1/08
[52] U.S. Cl. ........................................ 427/34; 427/423
[58] Field of Search ........................ 427/34, 201, 423; 428/547, 610; 419/5

[56] References Cited

U.S. PATENT DOCUMENTS

| | | | |
|---|---|---|---|
| 3,147,087 | 9/1964 | Eisenlohr | 428/547 |
| 3,467,588 | 9/1969 | Gebler et al. | 428/547 |
| 4,075,364 | 2/1978 | Panzera | 427/34 |
| 4,101,712 | 7/1978 | Bomford et al. | 428/547 |
| 4,107,392 | 8/1978 | Aoki et al. | 428/547 |
| 4,391,860 | 7/1983 | Rotolico et al. | 427/201 |
| 4,587,177 | 5/1986 | Toaz et al. | 428/610 |
| 4,588,607 | 5/1986 | Matarese et al. | 427/34 |
| 4,601,956 | 7/1986 | Dohnomoto | 428/610 |

Primary Examiner—John H. Newsome
Attorney, Agent, or Firm—Wenderoth, Lind & Ponack

[57] ABSTRACT

The present invention relates to a method of producing a functionally gradient material whose components and structure are continuously adjusted by the coating, plating and powder metallurgy techniques to change its function in turn and provide a method of producing a functionally gradient material superior in heat-resistance, corrosion-resistance and resistance to thermal fatigue by distributing a third component having a lower Young's modulus or formed of high-strength material sufficiently durable to the fracture strength among ceramics as a first component and metals or other ceramics as a second component to change the function.

5 Claims, 4 Drawing Sheets

Substrate

METHOD OF PRODUCING A FUNCTIONALLY GRADIENT MATERIAL

DETAILED DESCRIPTION OF THE INVENTION

1. Field of Industrial Use

The present invention relates to a method of producing a mono-layer and multi-layer composite material formed of ceramic layers and metallic layers and or ceramic layers and ceramic layers, in particular to a method of producing a functionally gradient material whose component and structure are continuously adjusted by the coating, plating and powder metallurgy techniques to change its function in turn.

2. Prior Arts and Problems thereof

One of the key-technologies for the development of aeronautics, space engineering and nuclear fusion reactors is the development of a super heat-resistant material superior in heat-blocking properties and the development of a heat-blocking material aiming for use in a light weight aircraft. To produce such heat blocking materials, there has been a method of coating ceramics and the like on the surface of metals and alloys. For example, according to one method MCrAlY (wherein M is a metal) is coated on the surface of a Ni-base super alloy by the plasma-coating method as a relaxation layer and then $ZrO_2Y_2O_3$ is coated on said relaxation layer formed of MCrAlY by the plasma-coating method. In addition, an ion-plating method is also used, in which a protective layer is impactly coated on a substrate by vaporization under vacuum of $10^{-2}$ to $10^{-3}$ Torr, a plasma-CVD method in which a heat-blocking coat is formed by the gas-phase synthesis. An ion bem method has also been frequently used for this purpose. It is important for the production of a mono-layer, two-layer—graduated multi-layer type coating layer superior in heat-blocking properties, whose insulating function and strength function are continuously changed by such insulative coating methods, to obtain a composite layer superior in thermal stress-resistance.

However, composite materials obtained by the conventional coating methods, plating methods and the like have provided no support for the calculation of a relaxation functional structure of thermal stress, but rather have shown a construction in which the composition is merely stepwise changed, so that it has been difficult to continuously control the density-form distribution of components so as to adequately obtain a minimum thermal stress distribution in correspondence to the temperature potential of each part of a material to obtain a material superior in adhesion.

Accordingly, such problems by the prior art method occur in that exfoliation and deterioration of the corrosion-resistance due to the initiation of cracks take place as a result of thermal fatigue and/or aging.

MEASURES FOR SOLVING THE PROBLEMS

It is an object of the present invention to provide a method of producing a functionally gradient material superior in heat-resistance, corrosion-resistance and thermal-stress fracture resistance by continuously controlling the structure and components and distributing a material having a lower Young's modulus and a higher strength as a third component to change its function.

The present inventors arrived at the present invention by determining the boundary conditions for the concentration-distribution function, distribution-form parameters and heat conduction equation of two components and determining the specific stress distribution (R) from the heat conductivity ($\lambda$), the Young's modulus (E) and the like and have discovered that the addition and distribution of a component having a lower Young's modulus and a higher strength as a third component is remarkably effective for the production of ceramic/metal—or ceramic/ceramic type functionally gradient material superior in adhesion and thermal stress fracture-resistance, since the stress-distribution level is reduced and equalized.

That is to say, the present invention relates to a method of producing a composite material comprising ceramics as a first component, metals or other ceramics as a second component and an intermediate layer arranged between said first component and said second component, in which a ratio of said second component to said first ingredient in quantity is continuously changed, characterized in that a component having a lower Young's modulus or a high-strength material having sufficiently endurable fracture strength is distributed in said intermediate layer as the third component, said third component being distributed so that the specific stress distribution R (R=thermal stress/mixed average compression fracture stress) may be equalized to a lower the average value.

EFFECTS

The present invention will be now be described in more detail with reference to the drawings, in which FIG. 1 is a diagram showing an infinite flat plate having a dimensionless thickness of the following magnitude X:

$$0 \leq X \leq 1$$

Figure 1:
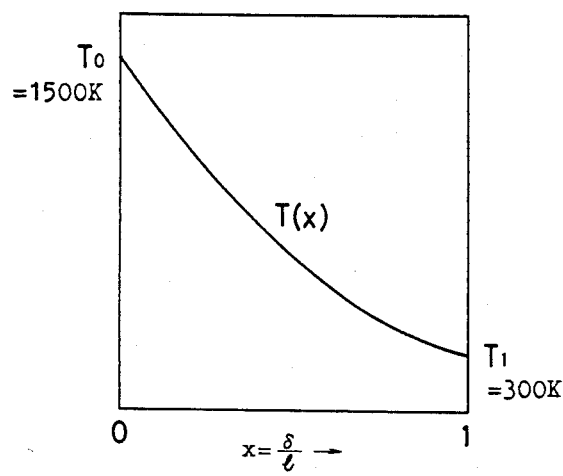

At first, as to the infinite flat plate, as shown in FIG. 1, having a dimensionless thickness X of the following magnitude:

$$0 \leq X \leq 1$$

the heat conduction equation, the concentration distribution function $g_A(X)$ of the component A, the concentration distribution function $g_B(X)$ and the physical property value function $f(X)$ are defined by the following equation (1) to (4):

$$(d/dx)\lambda(X)(dT/dx)=0 \tag{1}$$

wherein the boundary conditions $T(0)=1,500°$ K., $T(1)=300°$ K.

$g_A(X)=X^n \tag{2}$ $g_B(X)=1-X^n \tag{3}$

In this case, the physical property value distribution function is expressed in the form of the following equation (4):

$$f(X)=P_A X^n + P_B(1-x^n) \tag{4}$$

Figure 2:
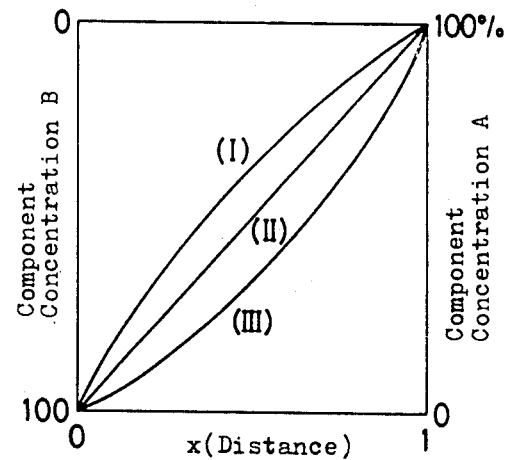
FIG. 2 is a schematic diagram showing a concentration distribution of a component A and a component B.

(wherein $P_A$, $P_B$ is each physical property-heat conductivity $\lambda$, Young's modulus E and linear expansion coefficient $\alpha$—of the component A and the component B, respectively.)

n is a distribution form parameter and the cases of (I) $0<n<1$, (II) $n=1$ and (III) $1<n$ are shown in FIG. 2.

Nextly, solving the equation (1) and the equation (2) under the following four assumptions, the temperature distribution $T(X)$, the thermal stress distribution $\sigma(X)$ and the specific stress distribution $R(X)$ are expressed by the following equation (5), (6) and (7), respectively:

Said four assumptions include (i) a stationary condition; (ii) an elastic deformation; (iii) the consideration of the dependency of the physical properties of the materials on the temperatures; and (iv) the dependency of the physical properties of a functionally gradient material upon a mixture average rule.

$$T(X) = K \cdot \int_O^X \frac{d\tau}{(\lambda_A - \lambda_B)\tau^n + \lambda_B} + 1,500 \tag{5}$$

wherein $$K = 1,200/ \int_O^X \frac{d\tau}{(\lambda_A - \lambda_B)\tau^n + \lambda_B} \tag{6}$$

$$\sigma(X) = -E(X)\alpha(X)\{T(X) - 300\}$$

wherein $E(X) = E_A X^n + E_B(1-X^n)$ $\sigma(X) = \alpha_A X^n + \alpha_B(1-X^n)$ $R(X) = \sigma(X)/\sigma_y(X) \tag{7}$ wherein $\sigma_y$ is a mixture average compression fracture stress.

It has been made obvious from the calculation results by these fundamental equations that it is important for the production of a material superior in bonding strength to suppress the value of $R(X)_{max}$ in the functionally gradient material as low as possible and make the distribution of that value uniform. The present invention is characterized in that in order to flatten the specific stress distribution $R(X)$ and reduce the stress level, ① a high-strength component and ② a component having a lower Young's modulus as a third component are added in an intermediate layer to which the structure and components are continuously changed. Said high-strength component ① and said component having a lower Young's modulus ② may be used individually or in combination. Since the distribution $R(X)$ and the highest value thereof $R(X)_{max}$ are changed in dependence upon the combination of the first component and the second combination, it is necessary to select and distribute the third component in correspondence to said combination.

It has been found from the investigation of the relation between n and $R(X)_{max}$ in the case of a typical ceramics/metal that $n \geq 1$ is optimum for the achievement of the minimum thermal stress level in a two components composite and in addition, the range of the $1 \leq n \leq 10$ is desirable in view of splicability at $X=1$.

Since the addition and distribution of the third component in correspondence to the value of the distribution $R(X)$ as above described leads to the reduction of the thermal stress level and the flattening of the distribution of thermal stress level, the addition and distribution of the third component positively affects the falling-out separation and the breakage of the coated layer.

Figure 3:
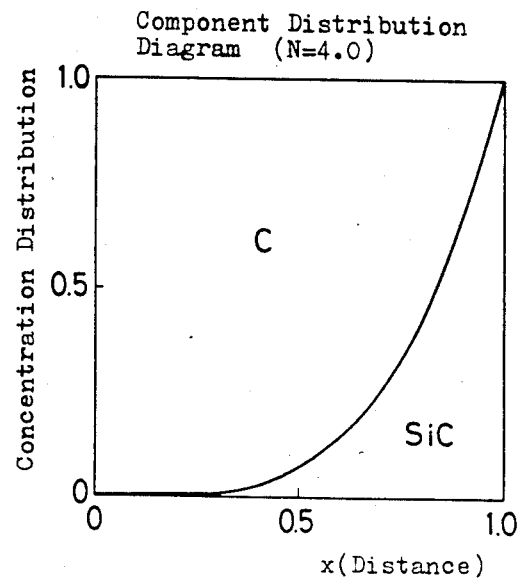
FIG. 3 is a component distribution diagram in the case where a distribution form parameter n is equal to 4, the component A being SiC, and the component B being C.
Figure 5:
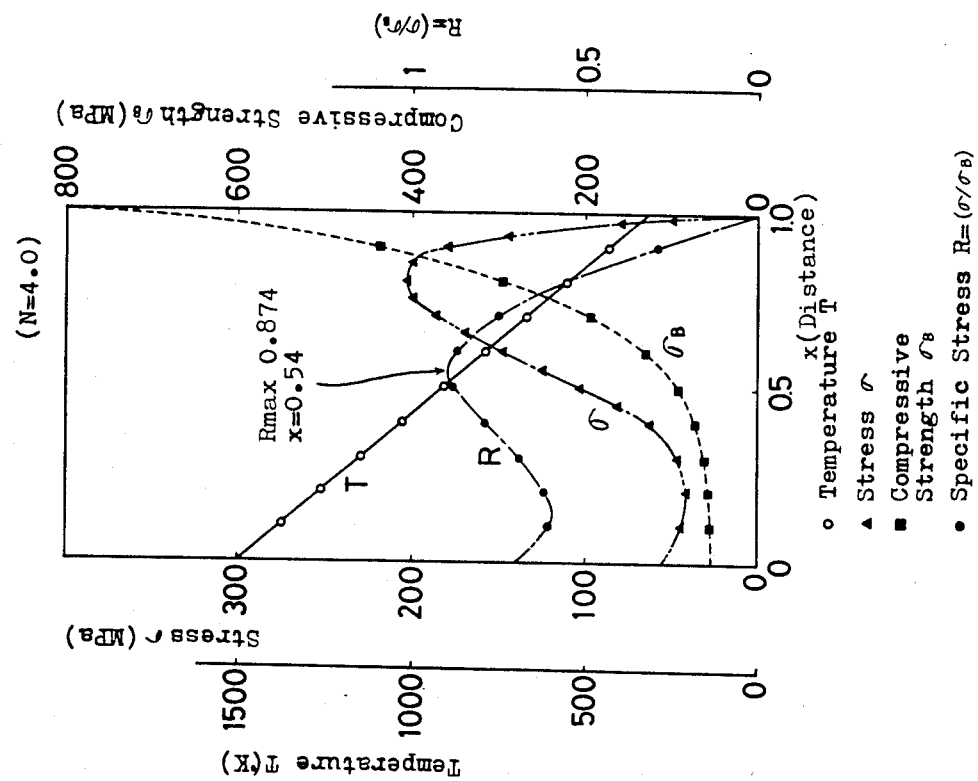
FIG. 5 is a graph showing the values of a temperature T, a stress $\sigma$ and a specific stress $\sigma/\sigma_y$ in the continuous layer.
Figure 4:
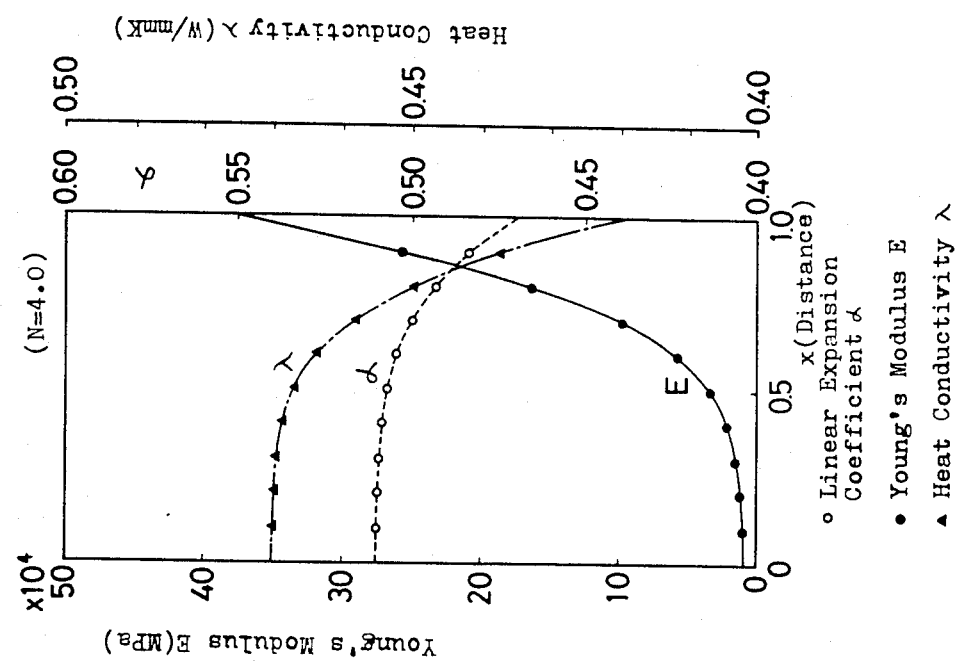
FIG. 4 is a graph showing the values of the physical properties in the continuous layer.

Nextly, the present invention, in which the first component is SiC and the second component is C, will be concretely described. FIG. 3 is a component-distribution diagram in the case where the first component is SiC, the second component is C, and the distribution parameter n being 4. In addition, the physical properties of the intermediate layer are shown in FIG. 4. The temperature-distribution, stress-distribution and specific stress distribution $R(X)$ are obtained by the use of these values with the results as shown in FIG. 5. In order to make this $R(X)$ uniform and reduce the average value of $R(X)$, TiC is distributed in correspondence to the distribution of $R(X)$, for example in a sine-curved shape, and simultaneously micropores formed due to the thermal shrinkage by the cooling are distributed.

Thus, the specific stress distribution ($\sigma/\sigma_y$) can be flattened and minimized, whereby obtaining a superior bonded boundary surface and a higher strength.

A foamed metal, graphite powder and the like are effective as the third component having a lower Young's modulus.

In addition, in the production of such a functionally gradient material, a micro-scale controlling method, such as the CVD method and the PVD method, is suitable for the case of forming a thin film having a thickness of about several tens μm, while a large-scale controlling method, such as the powder arranging method, a plasma-torch method and a spray-forming method, is suitable for the case of producing a functionally gradient material having a large film thickness of about several mms.

EXAMPLES

The present invention will be below described in detail with reference to the Examples.

Example 1

Figure 6:
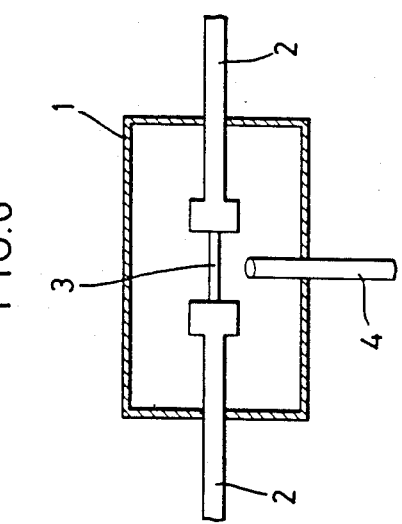
FIG. 6 is a diagram showing an apparatus for coating TiC, SiC and C by the CVD method.

As shown in FIG. 6, a pair of water-cooled copper electrodes 2 are inserted into a vessel 1 made of stainless steel which can be made vacuous, a graphite substrate (4 cm×1.2 cm×0.2 cm) 3 being put between said pair of water-cooled copper electrodes 2, and said graphite substrate 3 is electrified through said electrodes to heat the graphite substrate 3 up to 1,500° C. The measurement of a temperature is carried out by means of a two-color pyrometer and the temperature of the substrate is controlled within ±10° C. In addition, the vacuousity within a furnace is held at $10^{-3}$ Torr by means of a hydraulic rotary pump. Reference numeral 4 designates a gas inlet nozzle.

(A) At first $H_2$ gas is introduced into the furnace at a flow rate of 700 cm$^3$/min and then $C_3H_8$ gas at a flow rate of 30 cm$^3$/min. The pressure of the gas within the furnace is held at 10 Torr by means of a vacuum valve. This operation leads to the generation of a reaction $C_3H_8 \rightarrow C \downarrow + H_2$, thereby leading to the segregation of C on the graphite substrate.

Synthesized segregated C is plate-like shaped, having a density of 1.3 g/cm$^3$, and showing a columnar structure and an amorphous structure. The segregation speed of the plate-like shaped C is 0.6 mm/hr. Thus, a plate-like shaped segregated C of 0.6 mm thick is formed on the graphite substrate for 1 hour.

(B) SiCl$_4$ vapour is added to these raw material gasses by the use of $H_2$ gas as a carrier from another vessel (the vapour pressure is adjusted by changing the temperature) while holding the temperature, the flow rate of $C_3H_8$, the flow rate of $H_2$ and the pressure of the gas within the furnace constant. The flow rate of SiCl$_4$ is increased from 0 to 170 cm$^3$/min linearly within two hours.

The deposited substance obtained in this process is a functionally gradient material in which SiC fine particles are dispersed in a matrix formed of C as a result of the following reaction:

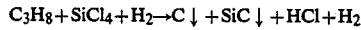

$$C_3H_8 + SiCl_4 + H_2 \rightarrow C \downarrow + SiC \downarrow + HCl + H_2$$

The deposited substance obtained in the case, where the flow rate of SiCl$_4$ is 30 cm$^3$/min, has a Si-content of 0.5 wt %, a density of the matrix formed of C being 2.0 g/cm$^3$, SiC flakes being dispersed in the form of β-type, and the size being 500 Å in diameter and 100 Å in thickness.

With an increase of the flow rate of SiCl$_4$ the density of the matrix formed of C, the Si-content and the size of SiC dispersed are all increased. On the other hand, the segregation speed is reduced with an increase of the flow rate of SiCl$_4$. These parameters are continuously changed for two hours, as above described. The segregated substance of 0.8 mm thick is obtained in this period of time. The dispersion condition of C and SiC in the segregated substance is changed from the condition, in which SiC is dispersed in C, to the condition, in which C is dispersed in SiC, with a lapse of time.

In said synthetic step of SiC+C, TiCl$_4$ vapour is simultaneously introduced into the furnace from another system so as to achieve a change in flow rate of from 0 to 10 cm$^3$/min within 15 minutes. The quantity of Ti contained in the composite material is continuously increased up to the maximum value of 0.2 wt % after 25 minutes. subsequently, upon changing the flow rate from 10 to 0 cm$^3$/min within 15 minutes, the content of Ti becomes 0 after 30 minutes since the state (B) started. Thus, TiC as the third component is distributed in a sine function manner, thereby reducing the stress level.

The TiC is dispersed as fine particles (0.1 μm or less) and the thermal expansion coefficient of TiC is larger than that of the matrix formed of C, so that micropores are formed at several atom intervals in the circumference of the fine particles of TiC at a point of time when they were cooled from the synthesis temperature. In a ternary (SiC-C-TiC) functionally gradient material the lower Young's effect due to these micropores and the increased strength effect due to the addition of TiC are overlapped, thereby achieving the flattening of the specific stress distribution.

(C) Subsequently, the segregation is carried out for one hour from three hours after since the synthesis was started under such conditions that the flow rate of SiCl$_4$ is maintained at 170 cm$^3$/min and the temperature, the flow rate of $C_3H_8$, the flow rate of $H_2$ and the pressure of the gas within the furnace are the same as those initially set. It is the β-type SiC that is segregated in this period of time. This β-type SiC has a density of 3.2 g/cm$^3$ and a columnar structure. The segregation speed of SiC is 0.2 mm/hr.

Figure 7:
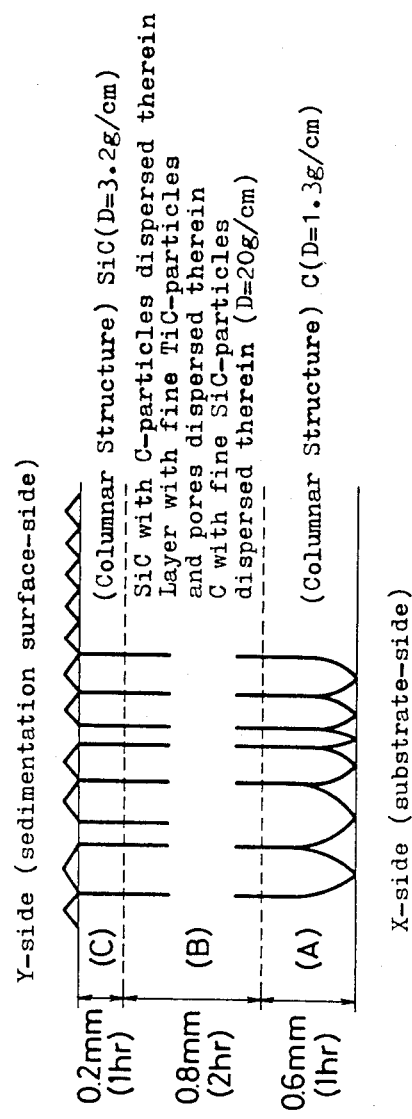
FIG. 7 is a schematic diagram showing a functionally gradient material comprising SiC, C and TiC in which a density form is continuously controlled.

A functionally gradient material having a continuously changed density and a controlled form as shown in FIG. 7 is obtained by the above described experimental synthesis. C can not be bonded with SiC by the conventional methods but according to the method of the present invention, C can be bonded with SiC through the continuously controlled stage (B) as shown in the drawing.

A lower-density C material, which is stable at higher temperatures but soft and easily oxidized, is formed on an X-side while a higher-density SiC material, which has a higher hardness and the superior oxidation-resistance, is formed on a Y-side. The central portion has both porperties. Although an attempt has been made to coat SiC on the C material, the SiC film is broken due to the generation of a stain resulting from the difference between C and SiC in linear expansion coefficient, so that it has been necessary that the SiC film be remarkably thin (several μm), but according to the method of the present invention, the strain can be alleviated by the existence of the micropores, thereby giving SiC in the portion (C) the thickness necessary and sufficient for use as a structural material.

A functionally gradient material, in which the structure, density and function are continuously changed, is disclosed in this Example. Such a functionally gradient material can not be obtained by the well-known solid reaction of C with SiC.

Example 2

A nickel-base superalloy IN 100 (8 cm × 10 cm × 0.2 cm) polished with waterproof emery No. 600 and scrubbed with trichloroethylene as a substrate is set in a water-cooled chamber.

Then, a composite coating layer with a continuously controlled structure is formed by the plasma spraying method while holding and adjusting the vacuousity within the chamber, whose inside is replaced with Ar gas, at about 80 to 200 Torr. This layer has a thickness of about 240 μm. In order to improve the splicing strength of the substrate with the coating layer, a travelling arc is generated between the substrate and a plasma gun electrode to heat the substrate up to about 700° to 800° C. Ar and H$_2$ gas are used as a plasma gas.

Figure 8:
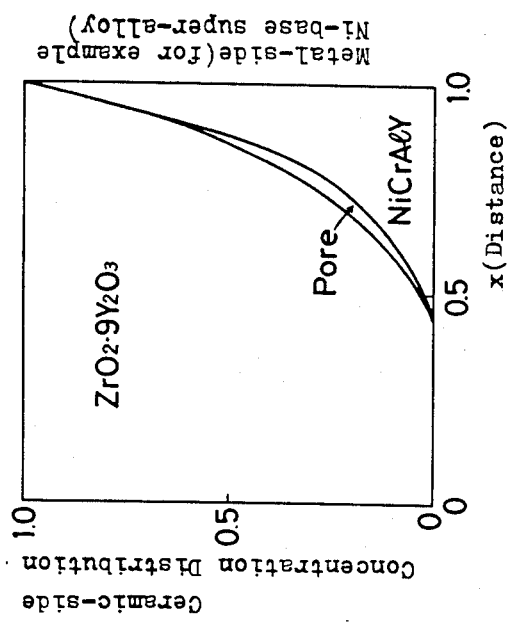
FIG. 8 is a component distribution diagram of a functionally gradient material comprising $ZrO_2.9Y_2O_3$ and NiCrAlY.

ZrO$_2$.9Y$_2$O$_3$ powders and Ni16Cr6AlO.6Y powders are used as spray powders. These powders are supplied to a plasma jet while continuously changing the ratio thereof and coated to obtain a continuous structural layer having a component distribution as shown in FIG. 8 and Table 1.

TABLE 1

| | Component Distribution (N = 5.0) | | |
|---|---|---|---|
| X | NiCrAlY | $ZrO_2.Y_2O_3$ | Pore |
| 0 | 0% | 100% | 0% |
| 0.6 | 7.8% | 92.2% | 0% |
| 0.8, | 30.5% | 64.5% | 5% |
| 1.0 | 100% | 0% | 0% |

At this time, the void ratio is increased by reducing the vacuousity in an atmosphere and increasing the particle diameter of powders supplied for use in the plasma and reduced by increasing the vacuousity and decreasing the particle diameter of powders supplied. A lower-Young's modulus layer is formed in the continuous structural layer by adjusting the vacuousity and the particle diameter in such a manner to distribute micropores in the sine-curved shape in a range of t from 0.6 to 1.0. This layer shows a function of relaxing a thermal stress. The resulting Ni-base superalloy plate with the composite layer is subjected to an annealing treatment for 5 hours at 1,100° C. under vacuum to improve the bonding strength due to the diffusion in the boundary surface (i), produce an alloy density of about 100% in a range of t from 0 to 0.6 (ii), and to produce the dispersed micropores spherical in shape in a range of t from 0.6 to 1.0 (iii). In the production of a $ZrO_2.9Y_2O_3$-Ni16C-r6AlO.6Y-coated Ni-base alloy according to this Example the ratio of $ZrO_2.9Y_2O_3$ to NiCrAlY is continuously changed by the plasma spray under vacuum and a micropore-distributed layer having a lower Young's modulus as the third layer is formed in the $ZrO_2.9Y_2O_3$-Ni16Cr6AlO.6Y-coated Ni-base alloy, so that a superior splicability can be given and a thermal stress-relaxing layer is formed, whereby the separation of the ceramic layer and the generation of cracks can be reduced remarkably in comparison with the conventional one. Accordingly, the resulting functionally gradient material can be used stably for a long time as a highly heat-resistant and heat-blocking composite material.

EXAMPLE 3

Figure 9:
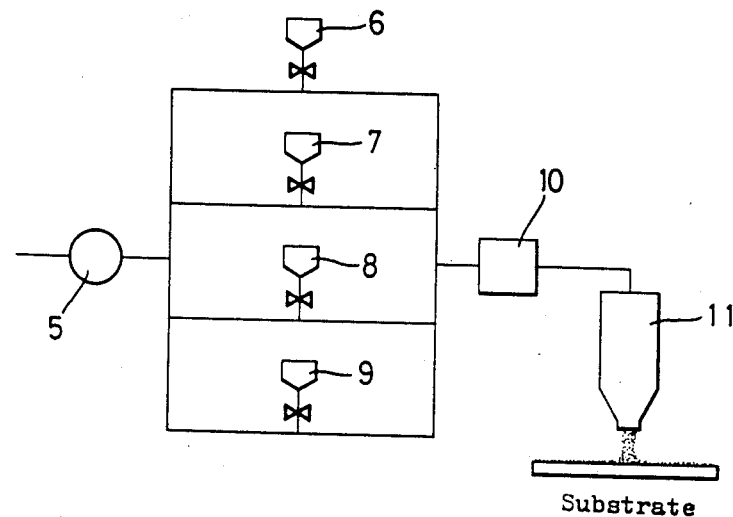
FIG. 9 is an outline showing one example of a powder-conveying device for arranging particles.

Ni powders having an average particle diameter of 3 μm and 30 μm and PSZ powders having an average particle diameter of 0.05 μm and 0.1 μm are used as raw material powders. But, the PSZ powders are used in the form of agglomerated powders having the adjusted secondary particle diameter of 50 to 100 μm. Ni powders having a particle diameter of 3 μm and PSZ powders having a particle diameter of 0.05 μm are mixed for 10 minutes in accordance with the component-distribution rule of n=5. Referring now to FIG. 9, reference numeral 5 designates a blower for use in the conveyance, 6 designating a feeder of Ni powders having a particle diameter of 3 μm, 7 designating a feeder of Ni powders having a particle diameter of 30 μm, 8 designating a feeder of PSZ powders having a particle diameter of 0.05 μm, 9 designating a feeder of PSZ powders having a particle diameter of 0.1 μm, 10 designating a powder-mixing and stirring mixer, and 11 designating a powder-collecting portion. The flow rate of the carrier gas is 10 to 20 m/s and the powder-settling and collecting speed is about 1 to 1.6 cm/s at that time. After a lapse of 10 minutes a quantity of Ni powders having a particle diameter of 30 μm or PSZ powders having a particle diameter of 0.1 μm fed is gradually increased to that a ratio of rough powders (PSZ powders having a particle diameter of 0.1 μm) may reach about 20% at a point of time of 15 to 20 minutes (corresponding to X=0.8) and then the quantity of the rough powders fed is gradually decreased so that the ratio of the rough powders may reach 0% at X=1. At this time, the relative density of the structure-controlled sediment is 30 to 40%. Nextly, the resulting structure-controlled sediment is preliminarily sintered in an atmosphere of hydrogen for 10 minutes at T=900° C. and successively, subjected to a CIP (cold isostatic pressing) molding process at P=450 MPa to obtain a molded product having a relative density of 60 to 70%. The relative structural distribution in the molded product shows no change.

Figure 10:
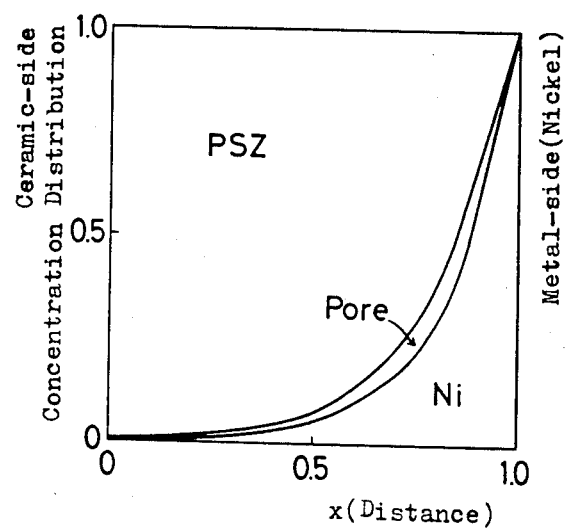
FIG. 10 is a component distribution diagram of a functionally gradient material comprising (partially stabilized $ZrO_2$ powders) and a functionally gradient material comprising PSZ and nickel.

This molded product is sintered for 3 hours at 1,250° C. in an atmosphere having a vacuousity of $10^{-3}$ to $10^{-5}$ Torr. The structural distribution is controlled by utilizing the differences in sintering speed due to the magnitude of the diameter of the raw material powders so that the micropore-distribution may reach the maximum value at a relative density of 80 to 100% and X=0.8. The component-distribution is shown in Table 2 and FIG. 10. A functionally gradient material superior in adhesion and sufficiently endurable to thermal stress fracture is obtained by distributing stress dispersion type micropores in the continuously-changed structural layer by the particle-arranging method under the above described conditions.

TABLE 2

| | Component Distribution (N = 5.0) | | | |
|---|---|---|---|---|
| X | Ni | PSZ (0.05 m) | PSZ (0.1 m) | Pore |
| 0 | 0% | 98.2% | 0% | 1.8% |
| 0.5 | 3% | 93.2% | 0% | 3.8% |
| 0.8 | 29.9% | 40.8% | 20.8% | 8.5% |
| 1.0 | 98.5% | 0% | 0% | 1.5% |

Effects of the Invention

As above described, according to the present invention, the density- and form distribution of the third component is controlled continuously so that the thermal stress distribution corresponding to the temperature potential may be equalized and the average stress value may be reduced, so that the separation of the heat-blocking ceramic layer and the like and the generation of cracks can be prevented, thereby obtaining a composite material superior in toughness, adhesion and insulating characteristic.

In addition, the function of the material can be controlled for each portion by continuously changing the structure, construction and components, thereby importing a specialized function (gradient function) to the material.

Thus, also a functionally gradient material superior in ultrahigh temperature-resistance/ultralow temperature-resistance, ultrahigh temperature-resistance/radiation damage-resistance, insulation-resistance/thermal deterioration-resistance, abrasion-resistance/toughness, optical character/magnetic permeability or the like can be obtained.

We claim:

1. A method of producing a functionally gradient material, in which a composite material, in which an intermediate layer with a continuously changing ratio of a second component to a first component is arranged between a ceramics as said first component and a metal or another ceramics as said second component, is produced, characterized in that a component having a lower Young's modulus or a high-strength material as a third component is distributed in said intermediate layer.

2. A method of producing a functionally gradient material as set forth in claim 1, characterized in that said third component is distributed so that the specific stress distribution R (R=thermal stress/mixture average compression fracture stress) may be equalized and an average value of R may be reduced.

3. A method of producing a functionally gradient material as set forth in claim 1, characterized in that said first component is C, said second component being SiC, and said third component being either TiC or micropores or both TiC and micropores.

4. A method of producing a functionally gradient material as set forth in claim 1, characterized in that said first component is $ZrO_2 \cdot Y_2O_3$, said second component is MCrAlY (M: metal), and said third component are micropores.

5. A method of producing a functionally gradient material as set forth in claim 1, characterized in that micropores are distributed as said third component and the powder metallurgical technology, in which a particle diameter of raw material powders is adjusted, is used for the formation of the distribution of said micropores.

* * * * *